United States Patent
Coursey et al.

(10) Patent No.: US 7,211,855 B2
(45) Date of Patent: *May 1, 2007

(54) INTERMEDIATE SEMICONDUCTOR DEVICE STRUCTURE INCLUDING MULTIPLE PHOTORESIST LAYERS

(75) Inventors: Belford T. Coursey, Meridian, ID (US); Brent D. Gilgen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/411,575

(22) Filed: Apr. 25, 2006

(65) Prior Publication Data

US 2006/0192238 A1   Aug. 31, 2006

Related U.S. Application Data

(60) Continuation of application No. 10/971,210, filed on Oct. 22, 2004, now Pat. No. 7,078,760, which is a division of application No. 10/133,295, filed on Apr. 26, 2002, now Pat. No. 6,893,958.

(51) Int. Cl.
*H01L 21/108* (2006.01)
*H01L 29/94* (2006.01)

(52) U.S. Cl. ..................................... 257/301

(58) Field of Classification Search .............. 257/301
See application file for complete search history.

(56) References Cited

U.S. PATENT DOCUMENTS

| 4,589,952 A | 5/1986 | Behringer et al. |
| 5,472,829 A | 12/1995 | Ogawa |
| 5,614,352 A | 3/1997 | Rahman |
| 5,963,841 A | 10/1999 | Karlsson et al. |
| 5,965,461 A | 10/1999 | Yang et al. |
| 6,107,172 A | 8/2000 | Yang et al. |
| 6,121,123 A | 9/2000 | Lyons et al. |
| 6,242,344 B1 | 6/2001 | Koh et al. |
| 6,319,821 B1 | 11/2001 | Liu et al. |
| 6,365,765 B1 | 4/2002 | Baldwin et al. |
| 6,458,705 B1 | 10/2002 | Hung et al. |
| 2002/0192595 A1 | 12/2002 | Otoguro et al. |

FOREIGN PATENT DOCUMENTS

JP    05-066568    3/1993

OTHER PUBLICATIONS

Wolf, Stanley and Tauber, Richard N., *Silicon Processing for the VLSI Era*, vol. 1, Lattice Press (1986), p. 564.

*Primary Examiner*—Asok Kumar Sarkar
(74) *Attorney, Agent, or Firm*—TraskBritt, PC

(57) ABSTRACT

The present invention prevents cross-linking between multiple resists that are used in the fabrication of a semiconductor device. In order to prevent resists in close proximity or contact with one another from cross-linking, a non-reactive separation layer is disposed between the resists. The separation layer prevents incompatible components of the resists from reacting with one another. Forming the separation layer between the resists allows a resist located above the separation layer to be polymerized and patterned as desired without patterning another resist located below the separation layer. Methods of patterning multiple resists are also disclosed.

25 Claims, 2 Drawing Sheets

INTERMEDIATE SEMICONDUCTOR DEVICE STRUCTURE INCLUDING MULTIPLE PHOTORESIST LAYERS

CROSS-REFERENCE TO RELATED APPLICATIONS

This application is a continuation of application Ser. No. 10/971,210, filed Oct. 22, 2004, now U.S. Pat. No. 7,078,760, issued Jul. 18, 2006, which is a divisional of application Ser. No. 10/133,295, filed Apr. 26, 2002, now U.S. Pat. No. 6,893,958, issued May 17, 2005.

BACKGROUND OF THE INVENTION

1. Field of the Invention

The present invention relates to the fabrication of semiconductor devices and, more specifically, to a method of preventing cross-linking between multiple photoresists used in fabrication of the semiconductor device and simultaneously present on a semiconductor device structure under fabrication.

2. State of the Art

Photoresist ("resist") layers are commonly used during semiconductor device fabrication to pattern a semiconductor substrate. A typical resist comprises a matrix or resin, a sensitizer such as a photoactive compound, and a solvent. When exposed to a specific wavelength of light, the photoactive compound initiates a photochemical reaction that causes the resist to cross-link. Images are patterned onto the semiconductor substrate by exposing portions of the cross-linked resist to the specific wavelength of light. The non-exposed and exposed portions are then developed to produce the desired pattern. Resists are also used to protect features during fabrication of the semiconductor device by covering those features with a resist layer.

Multiple resists may be used in the fabrication of a semiconductor device, with each resist formed on a portion of the semiconductor device. The resists may be simultaneously present on the intermediate semiconductor device structure. For example, a first resist may be used to protect features on the semiconductor device while a second resist may be formed over an active region of the semiconductor substrate to pattern the substrate. These resists may be formed in close proximity or contact with one another depending on the fabrication process being used. However, if the resists are in close proximity or contact, incompatible components of the resists may react with one another and cause the resists to react or cross-link. Cross-linking between resists is common between deep ultraviolet ("DUV"), I-line, and negative resists that are in close proximity or contact with one another. Cross-linking is especially common between I-line resists and negative resists. While cross-linking is common when at least one of the resists is unpolymerized, it may also occur when both of the resists are polymerized.

If resists in close proximity or contact cross-link with one another, they become unpatternable by conventional photolithographic processes because the resists are no longer selectively patternable. Therefore, in order to use two resists in close proximity or contact with one another, it would be desirable to be able to eliminate the potential for cross-linking between the resists.

BRIEF SUMMARY OF THE INVENTION

The present invention relates to the fabrication of semiconductor devices and to a method of preventing cross-linking between resists in an intermediate structure of the semiconductor device. The method includes providing a first resist, forming a separation layer in contact with the first resist, and providing a second resist in contact with the separation layer. The separation layer comprises an organic material that is substantially non-reactive with the first and second resists. The method further comprises patterning or removing the second resist without substantially patterning or removing the first resist. The separation layer and the second resist are simultaneously removed to expose the first resist, which is subsequently removed to expose underlying features of the semiconductor device.

The present invention also encompasses a method of multi-layer resist patterning. The method comprises providing a first resist in openings located in an active region of an intermediate semiconductor device structure. An organic separation layer is formed in contact with the first resist. A second resist is then provided in contact with the organic separation layer. The second resist is subsequently polymerized and patterned without patterning or removing the first resist. The organic separation layer and the second resist are simultaneously removed to expose the first resist, which is subsequently removed to expose underlying features of the semiconductor device.

An intermediate semiconductor device structure is also disclosed. The intermediate semiconductor device structure comprises a first resist, a separation layer, and a second resist. The separation layer comprises an organic material that is substantially non-reactive with the first resist and the second resist and that is of sufficient thickness to prevent incompatible components of the first and second resists from reacting with one another.

The present invention also discloses a container formed during fabrication of a semiconductor device. The container comprises an active region that includes multiple openings filled with a first resist. An organic separation layer is formed in contact with the first resist and a second resist is in contact with the organic separation layer. The organic separation layer is of sufficient thickness to prevent components of the first and second resists from reacting.

BRIEF DESCRIPTION OF THE DRAWINGS

By way of example only, an embodiment of the invention will be described with reference to the accompanying drawings.

DETAILED DESCRIPTION OF THE INVENTION

The present invention relates to the fabrication of semiconductor devices and, more specifically, to a method of preventing cross-linking between resists used in the fabrication of semiconductor devices.

In order to prevent resists from cross-linking, a separation layer may be disposed between the resists to prevent the components of each resist from reacting with one another. The separation layer may be disposed between a first resist and a second resist so that the first resist is located below the separation layer and the second resist is located above the separation layer. With the separation layer disposed between the two resists, the second resist may be polymerized and patterned, or otherwise processed, without substantially affecting the first resist or features located below the first resist. The separation layer and second resist may subsequently be removed to expose the first resist. It is also contemplated that the separation layer may be used when more than two resists are used in the fabrication process. For example, if three resists are needed in the fabrication process, two separation layers may be necessary. One separation layer may be disposed between the first and second resists and the second separation layer may be disposed between the second and third resists.

Figure 1A:
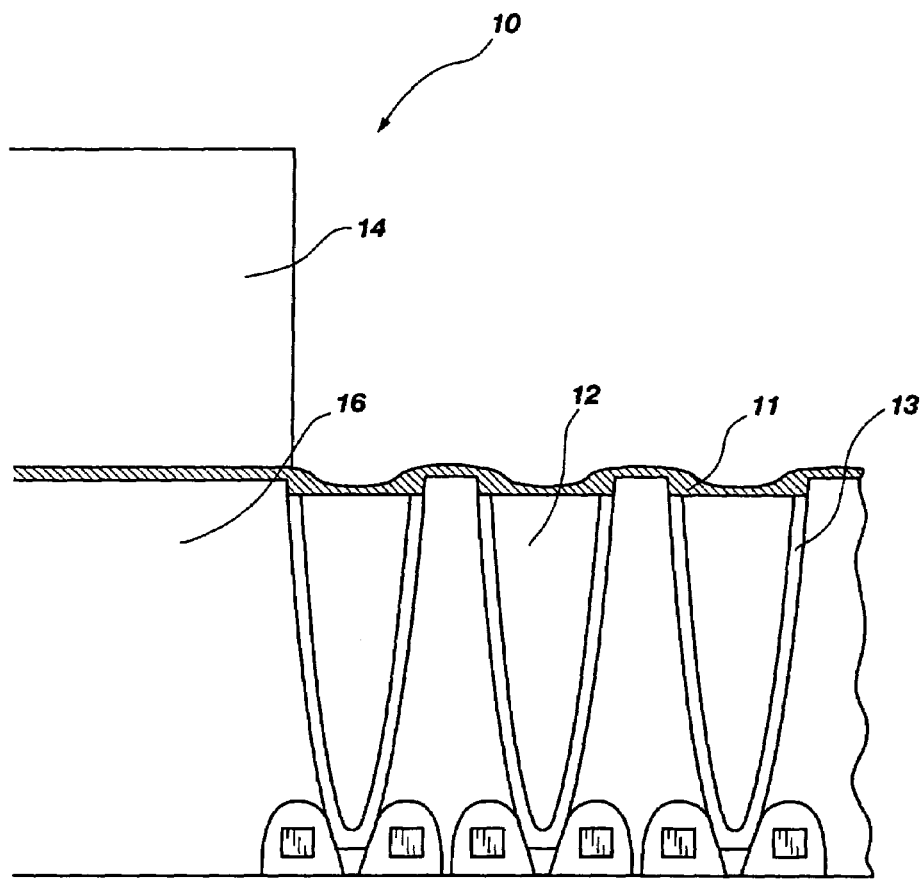
FIGS. 1a and 1b illustrate a container structure in an intermediate semiconductor device structure according to the present invention.
Figure 1B:
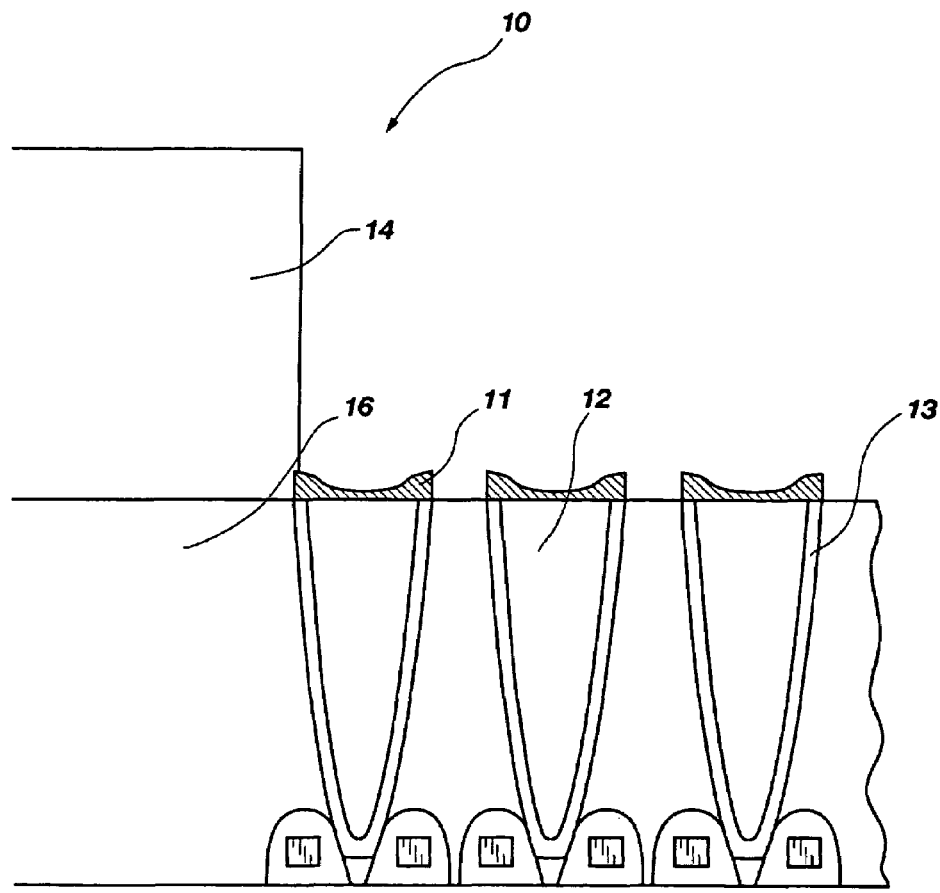

The separation layer of the present invention may be used to prevent cross-linking when the resists are in close proximity or contact with one another during the fabrication of a semiconductor device on a substrate of semiconductor material. As shown in FIG. 1a, the separation layer may be disposed as a layer that is substantially in contact with both the first and second resists. The separation layer is shown in FIG. 1a as bottom anti-reflective ("BARC") layer 11. However, the separation layer may also be selectively disposed between the resists and may be substantially in contact with only one of the resists. As shown in FIG. 1b, the separation layer, shown as BARC layer 11, is only substantially in contact with the first resist 12.

In a multi-layer resist patterning process, the first resist 12 may be used to protect features on the semiconductor device structure, while the second resist 14 may be used to pattern images onto the semiconductor device structure. This first resist 12 may be unpolymerized, making it easy to remove when features protected by first resist 12 need to be exposed or from spaces in which it is typically hard to remove resist. However, it is also contemplated that the separation layer may be disposed between multiple polymerized resists.

The separation layer comprises a material that is substantially non-reactive with the resists used in the fabrication process. Preferably, the separation layer is an organic material that is easy to apply at a low temperature, such as at approximately 20–23.5° C. The material of the organic separation layer may comprise a conventional spin-on film, a low-temperature film, or a spin-on glass. Preferably, the material is applied at approximately 21.5° C. Such an organic separation layer is also preferably easy to remove. The material of the organic separation layer may include, but is not limited to, an organic BARC material, an organic anti-reflective ("ARC") material, a polysulfone, or a polyimide. These materials are well known in the art.

In addition, the separation layer may comprise an inorganic material including, but not limited to, silicon nitride, silicon oxynitride, or silicon oxime. While inorganic materials may be used, organic materials are typically easier to remove and etch than inorganic materials and, therefore, are more desirable. In addition, the organic material is preferred because the organic separation layer and the second resist 14 may be simultaneously removed with one etching process, thereby reducing the number of steps in the fabrication process.

The required thickness of the separation layer is determined by the chemical properties of the resists used in the particular fabrication process. The separation layer may be of sufficient thickness to prevent the components of each resist from outgassing through the separation layer, thereby preventing incompatible components from coming into contact or close proximity with each other. While the thickness of the separation layer depends on the resists used, the separation layer may be approximately 400–1000 Å thick. Preferably, the separation layer has a thickness of approximately 600 Å.

In FIG. 1a, a first resist 12 and second resist 14 of container 10 are prevented from cross-linking by a separation layer. The container 10 is formed during fabrication of the semiconductor device and comprises an active region of the semiconductor device, such as oxide layer 16, having multiple openings or trenches. The openings are formed in a manner known in the art and are shown in FIG. 1a as filled with first resist 12. The walls of each opening are lined by a thin layer of polysilicon 13, which is used to create capacitor structures in the semiconductor device. The portions of the oxide layer 16 and polysilicon 13 are planarized and then the openings are filled with first resist 12. The separation layer is deposited over the filled openings and the oxide layer 16. In this embodiment, the separation layer comprises an organic BARC layer 11. However, it is to be understood that the separation layer may comprise any organic material previously discussed. The second resist 14 is then deposited over the organic BARC layer 11, above portions of the oxide layer 16 that do not comprise openings.

If the organic BARC layer 11 were not present during the fabrication of this container 10, portions of the first resist 12 and adjacent portions of the second resist 14 would cross-link, making the second resist 14 unpatternable. However, with the BARC layer 11 present, the first resist 12 and second resist 14 are separated and do not cross-link. The container 10 is subsequently formed by polymerizing the second resist 14 so that it may be patterned as desired. After patterning, the second resist 14 and the BARC layer 11 are removed by etching processes known in the art. The second resist 14 and the BARC layer 11 may also be simultaneously removed with a wet etch or dry etch process known in the art. The first resist 12 is then removed from the openings to expose the underlying polysilicon 13 for subsequent steps in the fabrication of the semiconductor device.

Since first resist 12 is not polymerized, it is easy to remove from the openings. However, the method of the present invention may also be used in container 10 if the first resist 12 is polymerized after being deposited in the openings because the BARC layer 11 may still be needed to separate the first resist 12 and the second resist 14, respectively.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. An intermediate semiconductor device structure comprising:
   a substrate;
   a first unpolymerized resist on the substrate;
   a separation layer above the first resist and in contact with the first resist; and
   a second resist on the substrate proximate the separation layer, wherein the separation layer is substantially non-reactive with the first resist and the second resist.

2. The intermediate semiconductor device structure of claim 1, wherein the separation layer comprises an organic material.

3. The intermediate semiconductor device structure of claim 1, wherein the separation layer is formed from one of an organic anti-reflective material, an organic bottom anti-reflective material, a polysulfone, and a polyimide.

4. The intermediate semiconductor device structure of claim 1, wherein the separation layer comprises an organic bottom anti-reflective material.

5. The intermediate semiconductor device structure of claim 1, wherein the separation layer comprises an inorganic material.

6. The intermediate semiconductor device structure of claim 1, wherein the separation layer is of a sufficient thickness to prevent components of the first resist and the second resist from reacting with one another.

7. The intermediate semiconductor device structure of claim 1, wherein the first resist comprises one of a deep ultraviolet resist, a negative resist, and an I-line resist.

8. The intermediate semiconductor device structure of claim 1, wherein the second resist is a polymerized resist.

9. The intermediate semiconductor device structure of claim 1, wherein the second resist is in contact with the separation layer.

10. A container structure formed during fabrication of a semiconductor device comprising:
    an active region comprising multiple openings in a portion of the active region;
    a first resist filling the multiple openings;
    an organic separation layer in contact with the first resist; and
    a second resist proximate the organic separation layer, wherein the organic separation layer is substantially non-reactive with the first resist and the second resist.

11. The container structure of claim 10, wherein the first resist is one of a deep ultraviolet resist, a negative resist and an I-line resist.

12. The container structure of claim 10, wherein the organic separation layer is one of an organic anti-reflective material, an organic bottom anti-reflective material, a polysulfone, and a polyimide.

13. The container structure of claim 10, wherein the organic separation layer is approximately 400–1000 Å thick.

14. The container structure of claim 10, wherein the first resist protects features on the semiconductor device.

15. The container structure of claim 10, wherein the organic separation layer is of a sufficient thickness to prevent components of the first resist and the second resist from reacting with one another.

16. The container structure of claim 10, wherein the first resist is an unpolymerized resist and the second resist is a polymerized resist.

17. The container structure of claim 10, wherein the first resist overlies a thin polysilicon film.

18. The container structure of claim 10, wherein the second resist overlies a portion of the active region that does not comprise the multiple openings.

19. An intermediate semiconductor device structure comprising:
    a first unpolymerized resist;
    a second resist proximate the first resist; and
    a first separation layer disposed between the first resist and second resist and having a sufficient thickness to prevent components of the first resist and the second resist from reacting with one another, wherein the separation layer is substantially non-reactive with the first resist and the second resist.

20. The intermediate semiconductor device structure of claim 19, wherein the first separation layer is one of an organic anti-reflective material, an organic bottom anti-reflective material, a polysulfone, and a polyimide.

21. The intermediate semiconductor device structure of claim 19, wherein the first separation layer comprises an inorganic material selected from the group consisting essentially of silicon nitride, silicon oxynitride, or silicon oxime.

22. The intermediate semiconductor device structure of claim 19, wherein each of the first resist and the second resist comprises one of a deep ultraviolet resist, a negative resist, and an I-line resist.

23. The intermediate semiconductor device structure of claim 19, further comprising a second separation layer between the second resist and a third resist.

24. The intermediate semiconductor device structure of claim 19, wherein the second resist is a polymerized resist.

25. The intermediate semiconductor device structure of claim 19, wherein the first resist and the second resist are in contact with the first separation layer.

* * * * *